United States Patent
Ballantine et al.

(10) Patent No.: US 7,804,391 B2
(45) Date of Patent: Sep. 28, 2010

(54) CHANGING AN ELECTRICAL RESISTANCE OF A RESISTOR

(75) Inventors: Arne W. Ballantine, Round Lake, NY (US); Cyril Cabral, Jr., Ossining, NY (US); Daniel C. Edelstein, White Plains, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 505 days.

(21) Appl. No.: 11/758,746

(22) Filed: Jun. 6, 2007

(65) Prior Publication Data

US 2007/0229212 A1    Oct. 4, 2007

Related U.S. Application Data

(62) Division of application No. 10/691,881, filed on Oct. 23, 2003, now Pat. No. 7,271,699, which is a division of application No. 09/693,765, filed on Oct. 20, 2000, now Pat. No. 6,647,614.

(51) Int. Cl.
    *H01C 10/00*    (2006.01)
(52) U.S. Cl. ............... 338/195; 338/308; 338/314; 219/121.6
(58) Field of Classification Search .......... 338/195, 338/197, 211, 308, 309, 314; 219/121.6, 219/121.69
    See application file for complete search history.

(56) References Cited

U.S. PATENT DOCUMENTS

| | | | |
|---|---|---|---|
| 3,842,495 A * | 10/1974 | Bennett et al. | 29/620 |
| 3,996,551 A | 12/1976 | Croson | |
| 4,622,856 A * | 11/1986 | Binder et al. | 73/727 |
| 4,714,911 A | 12/1987 | Di Mino et al. | |
| 4,792,779 A | 12/1988 | Pond et al. | |
| 4,907,341 A * | 3/1990 | Chapel et al. | 29/612 |
| 5,233,327 A * | 8/1993 | Bartush et al. | 338/195 |
| 5,468,672 A | 11/1995 | Rosvold | |
| 5,656,524 A | 8/1997 | Eklund et al. | |
| 5,685,995 A | 11/1997 | Sun et al. | |
| 5,821,160 A | 10/1998 | Rodriguez et al. | |
| 5,854,116 A | 12/1998 | Ohmi et al. | |
| 5,907,763 A | 5/1999 | Stamper et al. | |
| 6,461,211 B1 | 10/2002 | Raina et al. | |
| 6,480,092 B1 | 11/2002 | Hoshii et al. | |
| 6,647,614 B1 * | 11/2003 | Ballantine et al. | 29/610.1 |

* cited by examiner

*Primary Examiner*—Kyung Lee
(74) *Attorney, Agent, or Firm*—Schmeiser, Olsen & Watts; Wenjie Li

(57) ABSTRACT

An electrical structure. The electrical structure includes a resistor having a length L and an electrical resistance R(t) at a time t; and a laser radiation directed onto a portion of the resistor, wherein the portion of the resistor includes a fraction F of the length L, wherein the laser radiation heats the portion of the resistor such that the electrical resistance R(t) instantaneously changes at a rate dR/dt, and wherein the resistor is coupled to a semiconductor substrate.

14 Claims, 6 Drawing Sheets

CHANGING AN ELECTRICAL RESISTANCE OF A RESISTOR

Divisional application of Ser. No. 10/691,881, filed Oct. 23, 2003 now a U.S. Pat. No. 7,271,699; which is a divisional application of Ser. No. 09/693,765, now a U.S. Pat. No. 6,647,614, filed Oct. 20, 2000.

BACKGROUND OF THE INVENTION

1. Technical Field

The present invention provides a method and structure for changing the electrical resistance of a resistor.

2. Related Art

A resistor on a wafer may have its electrical resistance trimmed by using laser ablation to remove a portion of the resistor. For example, the laser ablation may cut slots in the resistor. With existing technology, however, trimming a resistor by using laser ablation requires the resistor to have dimensions on the order of tens of microns, which is large enough to be compatible with the laser spot dimension and laser alignment. A method is needed to trim a resistor having dimensions at a micron or sub-micron level.

SUMMARY OF THE INVENTION

The present invention provides a method for changing an electrical resistance of a resistor, comprising:

providing a resistor having a length L and a first electrical resistance $R_1$; and exposing a portion of the resistor to a laser radiation for a time of exposure, wherein the portion of the resistor includes a fraction F of the length L, wherein at an end of the time of exposure the resistor has a second electrical resistance $R_2$, and wherein $R_2$ is unequal to $R_1$.

The present invention provides an electrical structure, comprising:

a resistor having a length L and an electrical resistance R(t) at a time t; and a laser radiation directed onto a portion of the resistor, wherein the portion of the resistor includes a fraction F of the length L, and wherein the laser radiation heats the portion of the resistor such that the electrical resistance R(t) instantaneously changes at a rate dR/dt.

The present invention provides an electrical resistor of length L, comprising N layers denoted as layers 1, 2, ..., N;

wherein a portion of the resistor includes a fraction F of the length L;

wherein N is at least 2;

wherein layer I includes an electrically conductive material $M_I$ for I=1, 2, ..., N;

wherein layer J is in electrically conductive contact with layer J+1 for J=1, 2, ..., N−1; and wherein a cell $C_{K,K+1}$ couples a cell $C_K'$ of the layer K to a cell $C_{K+1}'$ of the layer K+1, wherein the cell $C_K'$ is within the portion of the resistor and includes the material $M_K$, wherein the cell $C_{K+1}'$ is within the portion of the resistor and includes the material $M_{K+1}$, wherein the cell $C_{K,K+1}$ is within the portion of the resistor and includes an electrically conductive material $M_{K,K+1}$ that comprises a chemical combination of the material $M_K$ from the layer K and the material $M_{K+1}$ from the layer K+1, and wherein K is selected from the group consisting of 1, 2, ..., N−1, and combinations thereof.

The present invention provides an electrical resistor of length L, comprising:

a first portion having a length $L_1$, wherein the first portion includes at least one cell having an electrically conductive material with a first structure; and a second portion of length $L_2$ such that $L_2=L-L_1$, wherein the second portion includes a fraction F of the length L such that $F=L_2/L$, wherein the second portion includes a structured cell having the electrically conductive material with a second structure, and wherein the electrically conductive material with the second structure has resulted from a laser heating of the electrically conductive material with the first structure.

The present invention provides a method for changing an electrical resistance of a resistor having dimensions at a micron or sub-micron level.

DETAILED DESCRIPTION OF THE INVENTION

Figure 1:
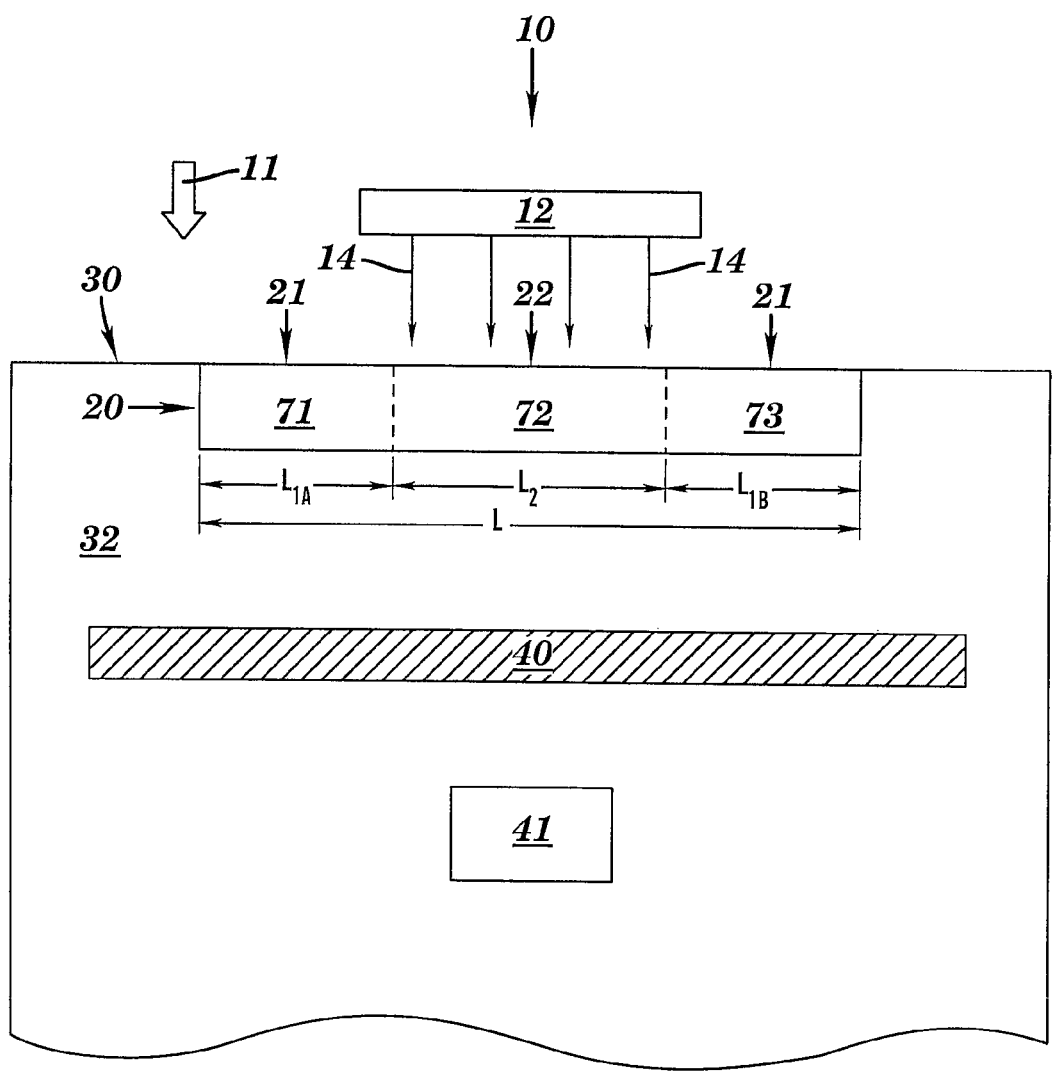
FIG. 1 depicts a front cross sectional view of an electronic structure with laser radiation directed on a resistor, in accordance with embodiments of the present invention.

FIG. 1 illustrates a front cross sectional view of an electronic structure 10, in accordance with embodiments of the present invention. The electronic structure 10 comprises a laser radiation 14 emitted from a laser source 12 and directed on a resistor 20 of length L in a direction 11. The laser radiation 14 is directed on the resistor 20 for a finite time duration ("time of exposure"). The laser radiation 14 includes a continuous laser radiation or a pulsed laser radiation.

For simplicity, FIG. 1 (as well as each of the other FIGS. 2-8) describes the resistor 20 on which the radiation 14 is directed as being characterized by a length L. Nonetheless, it should be understood that the radiation 14 may be directed on an area A of the resistor 20 as well as along the length L (or a fraction thereof). Accordingly, wherever in this detailed description a linear length L (or the fraction thereof) is referred to, it should be understood that the formulation is equally applicable to the area A (or the fraction thereof) in substitution for the length L (or a fraction thereof).

An interaction of the laser radiation 14 with the resistor 20 serves to induce a change in electrical resistance of the resistor 20 by heating the resistor 20. Such heating causes chemical or structural changes in the resistor 20, which results in an electrical resistance change. Thus, if the resistor 20 has an electrical resistance $R_1$ prior to exposure to the laser radiation 14, then the resistor 20 will have an electrical resistance $R_2$ after exposure to the laser radiation 14, wherein $R_2$ is unequal to $R_1$. $R_1$ and $R_2$ are related according to either $R_2 > R_1$ or $R_2 < R_1$, depending on the chemical or structural changes that occur in the resistor 20 as a consequence of the exposure to the laser radiation 14. The laser radiation 14 must be sufficiently energetic to provide the required heating of the resistor 20, and a minimum required energy flux of the laser radiation 14 depends on the material composition of the resistor 20. If the resistor 20 comprises a metal, then the present invention will be effective for a wide range of wavelengths of the laser radiation 14, since a metal is characterized by a continuum of energy levels of the conduction electrons rather than discrete energy levels for absorbing the laser radiation 14. Noting that the energy of a photon of the laser radiation 14 varies inversely with the wavelength of the photon (or equivalently of the laser radiation 14), the laser radiation 14 should be sufficiently focused so that the aforementioned energy flux requirement is satisfied.

A magnitude of the resistance change $R_2-R_1$ depends on the time of exposure, since as additional time elapses during the exposure of the resistor 20 to the laser radiation 14, additional chemical or structural changes occur in the resistor 20 resulting in additional changes in electrical resistance. After a sufficiently long time of exposure T to the laser radiation 14, essentially all of the matter in the resistor 20 capable of being chemically or structurally changed by exposure to the laser radiation 14 has indeed been so changed. Accordingly, if a fixed geometric portion of the resistor 20 is exposed to the laser radiation 14, the resistor 20 is said to have partially reacted if the time of exposure is less than T, and fully reacted if the time of exposure is at least T. If the resistor 20 has partially reacted, additional exposure of the resistor 20 to the laser radiation 14 changes the electrical resistance of the resistor 20 from $R_2$ to $R_3$ wherein $R_3$ differs from $R_2$. If the resistor 20 has fully reacted, additional exposure of the resistor 20 to the laser radiation 14 leaves the electrical resistance of the resistor 20 invariant at the value of $R_2$, or negligibly changes the electrical resistance of the resistor 20 from $R_2$ to $R_3$ wherein $R_3$ is about equal to $R_2$.

For notational purposes, let the resistor 20 be exposed to the laser radiation 14 from time $t_1$ to time $t_2$; i.e., during times t such that $t_1 \leq t \leq t_2$. Further, let R(t) denote an instantaneous electrical resistance of the resistor 20 at time t, and let dR/dt denote an instantaneous time rate of change of R(t) at time t. Thus, $R_1=R(t_1)$ and $R_2=R(t_2)$. From the initial time $t_1$ until a threshold time $t_{TH}<t_2$, the resistor 20 is insufficiently heated to be chemically or structurally changed by the laser radiation 14. Thus during $t_1 \leq t \leq t_{TH}$, R(t) remains unchanged at the initial value $R_1$ (i.e., dR/dt=0). If $t_2<T$, then the resistor 20 has partially reacted during $t_{TH} \leq t \leq t_2$, such that R(t) either increases (i.e., dR/dt>0) or decreases (i.e., dR/dt<0). If $t_2 \geq T$, then the resistor 20 has partially reacted during $t_{TH} \leq t<T$ (i.e., dR/dt<0 or dR/dt>0) and is fully reacted during $T \leq t \leq t_2$ (i.e., dR/dt=0). In summary: if $t_2<T$, then the resistor 20 has partially reacted when exposure to the laser radiation 14 is terminated at time $t_2$ and dR/dt≠0 at t=$t_2$. In contrast, if $t_2 \geq T$, then the resistor 20 has fully reacted when exposure to the laser radiation 14 is terminated at time $t_2$ and dR/dt=0 at t=$t_2$.

The resistor 20 comprises a first portion 21 and a second portion 22. The laser radiation 14 is directed on the second portion 22, but not on the first portion 21. Thus, the laser radiation 14 will change an electrical resistance of the second portion 22 and will not change an electrical resistance of the first portion 21. The first portion 21 includes two separated blocks, designated as a block 71 of length $L_{1A}$ and a block 73 of length $L_{1B}$. The second portion 22 includes a block 72 of length $L_2$. The resistor 20 includes M layers (not shown in FIG. 1), and the blocks 71, 73, and 72 each include M cells (also not shown in FIG. 1), wherein $M \geq 1$. Although, FIG. 1 does not depict a layer structure with included cells for the resistor 20, FIGS. 2-3, 4-5, and 6-7 respectively depict a one-layer structure with included cells, a two-layer structure with included cells, and an N-layer ($N \geq 2$) structure with included cells, of the resistor 20.

Returning to FIG. 1, L, $L_{1A}$, $L_{1B}$, and $L_2$ are related according to $L=L_1+L_2$, wherein $L_1=L_{1A}+L_{1B}$. $L_{1A}$ and $L_{1B}$ satisfy $L_{1A} \geq 0$ and $L_{1B} \geq 0$, respectively. The second portion 22 of the resistor 20 includes a fraction F of the length L that is exposed to the laser radiation 14, wherein $F=L_2/L$. Accordingly, F=1 if $L_{1A}=L_{1B}=0$, and F<1 if $L_{1A}>0$ or $L_{1B}>0$. Additionally, a spot dimension of the laser radiation 14 is no greater than a product of F and L and may be less than the product of F and L. A laser spot dimension is defined herein as a characteristic linear dimension of an intersection of a laser beam with a surface of a resistor. Thus, if the laser were to project a circle of radiation onto the resistor surface, than the laser spot dimension would be the magnitude of the diameter of the circle.

Based on preceding discussions and the allowable range of F, the following embodiments are within the scope of the present invention:

a) partially reacting the whole resistor 20 ($t_2<T$ and F=1);
b) fully reacting the whole resistor 20 ($t_2 \geq T$ and F=1);
c) partially reacting less than the whole resistor 20 ($t_2 \geq T$ and F<1); and
d) fully reacting less than the whole resistor 20 ($t_2 \geq T$ and F<1).

Because of a precision with which the laser radiation 14 may be focused, the present invention is applicable to resistors having the length L (or more generally, a product of F and L) as small a laser spot dimension. With current and future projected technology, laser spot dimensions of the order of 1 micron or less are possible. Thus, the present invention may be used for both large portions of resistors (i.e., a product of F and L exceeds about 1 micron) and small portions of resistors (i.e., a product of F and L does not exceed about 1 micron).

The resistor 20 is shown in FIG. 1 as coupled to a substrate 30. The substrate 30 may be, inter alia, a semiconductor substrate that includes semiconductor material or a semiconductor device. The substrate 30 may include an insulator 32. The resistor 20 may be conductively coupled (using, inter alia, conductively plated vias, etc.) to internal electronic structure (e.g., transistors, wiring, etc.) within the substrate 30. The substrate 30 may also include a plate 40 (e.g., a metal plate) to absorb laser radiation 14 that bypasses, or passes through, the resistor 20. A portion of the insulator 32 is disposed between the resistor 20 and the plate 40. The plate 40 serves to protect vulnerable structures (e.g., transistors, wiring, etc.) underneath the resistor 20 from being damaged or altered by the laser radiation 14. For example, the plate 40 protects the electrical structure 41 which may include, inter alia, transistors or wiring. The plate 40 should be sufficiently thick that the laser radiation 14 does not pass through a total thickness of the plate 40. A minimum thickness of the plate 40 depends on a material composition of the plate 40 and on the energy flux of the laser radiation 14. A representative range of minimum thickness of the plate 40 includes, inter alia, about 0.1 microns to about 5 microns, with a nominal thickness of about 0.5 microns.

In some applications, it is desirable to adjust $R_2$ to match a predetermined target resistance $R_t$ for the electrical resistance of the resistor 20. The target resistance $R_t$ is based on the pertinent application. For example, in an analog circuit $R_t$ may be a function of a capacitance in the circuit, wherein for the given capacitance, $R_t$ has a value that constrains the width of a resonance peak to a predetermined upper limit. In practice, the resistor 20 may be fabricated as coupled to the substrate 30 and the predetermined resistance $R_t$, together with an associated resistance tolerance $\Delta R_1$, may be provided for the intended application. Then the resistor 20 is exposed to the laser radiation 14, wherein the time of exposure $t_2-t_1$ may be selected based on any method or criteria designed to obtain $R_2$ as being within $R_t \pm \Delta R_t$ (i.e., $R_t - \Delta R_t \leq R_2 \leq R_t + \Delta R_t$). For example, calibration curves derived from prior experience may be used for determining the time of exposure $t_2-t_1$ that results in $R_2$ being within $R_t \pm \Delta R_t$.

After the resistor 20 has been exposed for the time of exposure $t_2-t_1$, the resistor 20 may be tested to determine whether $R_2$ is within $R_t \pm \Delta R_t$. If $R_2$ is not within $R_t \pm \Delta R_t$ as determined by the testing, then an iterative procedure involving additional exposure to the laser radiation 14 may be used to change $R_2$ to a value that is within $R_t \pm \Delta R_t$. Such an iterative procedure can be used only if the resistor 20 has been underexposed, rather than overexposed or sufficiently exposed, to the laser radiation 14, since a value of $R_2$ that results from overexposure or sufficient exposure cannot be further changed to within $R_t \pm \Delta R_t$ by additional exposure. Mathematically, underexposure is characterized by $(R_2-R_1)(R_1-R_2)>0$, overexposure is characterized by $(R_2-R_1)(R_t-R_2)<0$, and sufficient exposure is characterized by $(R_2-R_1)(R_t-R_2)=0$. Thus if the resistor 20 has been underexposed, the iteration procedure may be utilized such that each iteration of the iteration procedure includes:

additionally exposing the fraction F of the length L of the resistor 20 to the laser radiation 14, resulting in a new electrical resistance $R_2'$ of the resistor 20; and additionally testing the resistor 20 after the additionally exposing step to determine whether $R_2'$ is within $R_t \pm \Delta R_t$, and ending the iteration procedure if $R_2'$ is within $R_t \pm \Delta R_t$ or if $(R_2'-R_1)(R_t-R_2') \leq 0$.

An alternative testing procedure includes testing the resistor 20 in situ during the exposing of the resistor 20 to the laser radiation 14, regardless of whether the laser radiation 14 is a continuous laser radiation or a pulsed laser radiation. The testing during the exposing of the resistor 20 to the laser radiation 14 determines continuously or periodically whether $R_2''$ is within $R_t \pm \Delta R_t$, wherein $R_2''$ is the latest resistance of the resistor 20 as determined by the testing. The testing is terminated if $R_2''$ is within $R_t \pm \Delta R_t$ or if $(R_2''-R_1)(R_t-R_2'') \leq 0$.

Figure 2:
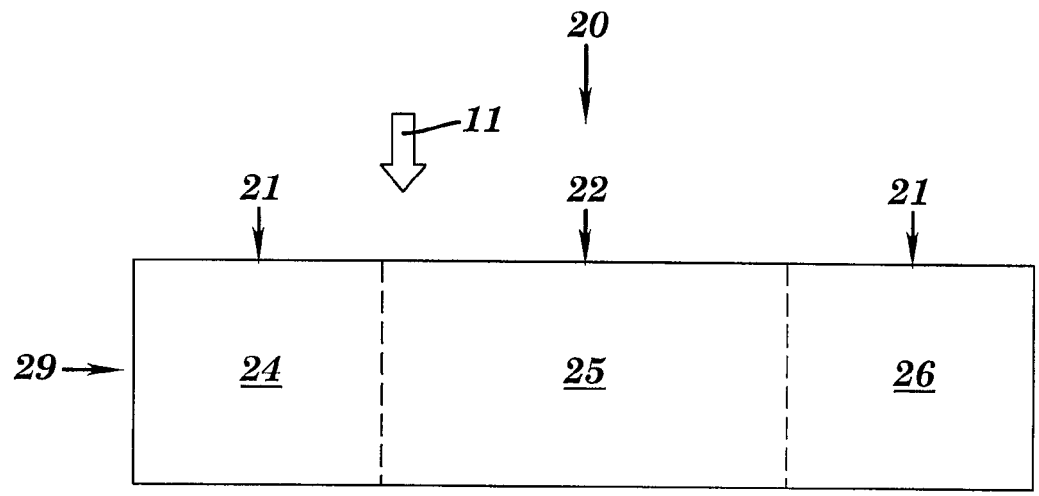
FIG. 2 depicts a one-layer embodiment of the resistor of FIG. 1 prior to being irradiated with the laser radiation.

FIG. 2 illustrates a one-layer embodiment of the resistor 20 of FIG. 1 prior to being irradiated with the laser radiation 14. In FIG. 2, the resistor 20 comprises the layer 29. The first portion 21 of the resistor 20 includes cells 24 and 26, which are respectively included within the blocks 71 and 73 of FIG. 1. The second portion 22 of the resistor 20 includes cell 25, which is within the block 72 of FIG. 1. The cell 25 is disposed between the cell 24 and the cell 26. The layer 29 includes an electrically conductive material that is capable of having its electrical resistance changed by the laser radiation 14 of FIG. 1. Cell 25, but not cells 24 and 26, will be subsequently irradiated by the laser radiation 14.

Figure 3:
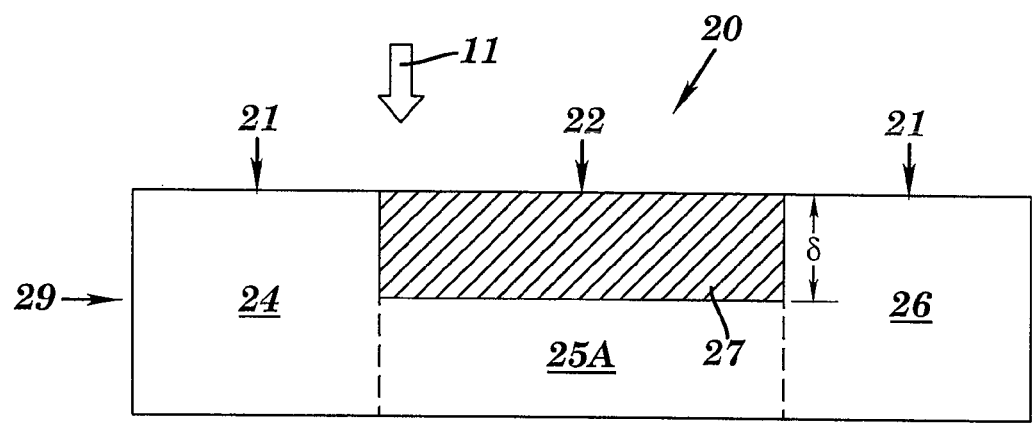
FIG. 3 depicts the one-layer embodiment of the resistor of FIG. 2 after being irradiated with the laser radiation.

FIG. 3 illustrates the one-layer embodiment of the resistor 20 of FIG. 2 after the cell 25 has been irradiated with the laser radiation 14 of FIG. 1. The irradiation has transformed the cell 25 into two cells, namely cells 25A and cell 27. Cells 27 and 25A are each disposed between the cell 24 and the cell 26. Cell 27 represents a portion of the cell 25 that has been structurally changed by the laser radiation 14. Cell 25A is a remaining portion of cell 25 that has not been changed (i.e., unreacted) by the laser radiation 14 and thus includes the same material, structurally and chemically, as in cell 25. Thus, the electrical resistance $R_2$ of the laser-exposed resistor 20 differs from the initial electrical resistance $R_1$ because cell 27 includes the electrically conductive material of cell 25 as structurally transformed, as discussed in the following examples. In a first example, the electrically conductive material of the layer 29, and thus of the cell 25, may be an amorphous metallic material including, inter alia, an amorphous metal or an amorphous metallic alloy such as titanium nitride (TiN), tantalum silicon nitride (TaSiN), tungsten nitride (WN), wherein the amorphous metallic material has been changed by the laser radiation 14 into a crystalline metallic material in cell 27. In a second example, the electrically conductive material of the layer 29, and thus of the cell 25, may be a polycrystalline metal, wherein a first phase of the polycrystalline metal has been changed by the laser radiation 14 into a second phase of the polycrystalline metal in cell 27. To illustrate, a tetragonal phase (β-Ta) of the polycrystalline metal tantalum, which has a bulk resistivity of about 200 μohm-cm, may be changed by the laser radiation 14 into a body-centered cubic phase (α-Ta), which has a bulk resistivity of about 20 μohm-cm. Note that upon a presence of impurities, it is possible for the reverse transformation to occur upon exposure to the laser radiation 14; i.e., for the body-centered cubic phase (α-Ta) of the polycrystalline metal tantalum to be changed into the tetragonal phase (β-Ta). In a third example, a metallic oxide comprising an metal oxide or a metallic alloy oxide may be irradiated and heated by laser radiation 14 to generate the metal or metallic alloy and oxygen gas. To illustrate, platinum oxide ($PtO_X$) where the subscript X is in a range of 0.5-1.5, palladium oxide (PdO), irridium oxide ($IrO_2$), or platinum palladium oxide ($PtPdO_Z$—oxides of a platinum palladium alloy) each may be irradiated and heated by laser radiation 14 to generate the metal platinum (Pt), the metal palladium (Pd), the metal irridium (Ir), or the metallic alloy platinum palladium (PtPd), respectively, and oxygen gas ($O_2$), wherein the platinum, palladium, irridium, and platinum palladium each have a lower resistance than platinum oxide, palladium oxide, irridium oxide, and platinum palladium oxide, respectively (i.e., $R_2 < R_1$).

The magnitude of the resistance change $R_2-R_1$ in FIG. 3 is a function of a thickness δ of the cell 27. δ increases as the time of exposure $t_2-t_1$ increases until the resistor 20 has been fully reacted, after which δ will no longer increase. If the resistor 20 has been fully reacted, all of the electrically conductive material of cell 25 may have been structurally changed by the laser radiation 14 such that the cell 25A does not appear in FIG. 3; i.e., δ is increased such that the cell 27 occupies the entire space of cell 25A in FIG. 3.

Figure 4:
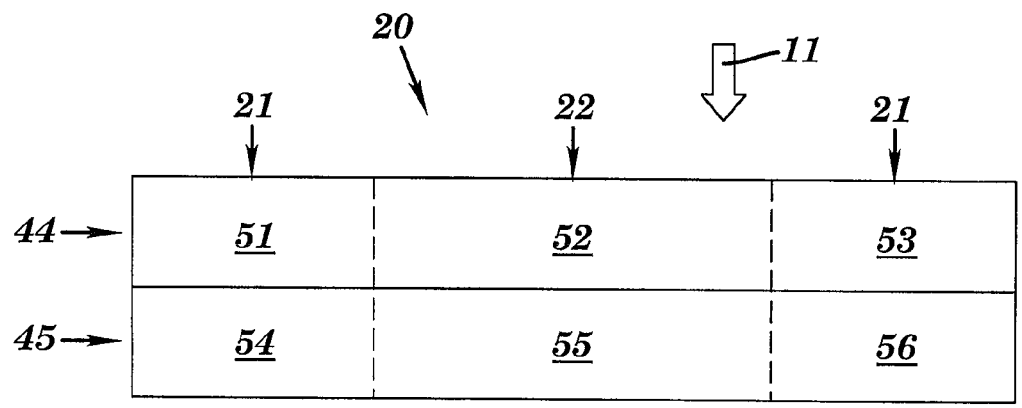
FIG. 4 depicts a two-layer embodiment of the resistor of FIG. 1 prior to being irradiated with the laser radiation.

FIG. 4 illustrates a two-layer embodiment of the resistor 20 of FIG. 1 prior to being irradiated with the laser radiation 14. In FIG. 4, the resistor 20 comprises the layers 44 and 45, wherein the layer 44 is in electrically conductive contact with the layer 45. The first portion 21 of the resistor 20 includes cells 51 and 53 in the layer 44, and cells 54 and 56 in the layer 45. The block 71 of FIG. 1 includes the cells 51 and 54, and the block 73 of FIG. 1 includes the cells 53 and 56. The second portion 22 of the resistor 20 includes a cell 52 in the layer 44 and a cell 55 in the layer 45. The block 72 of FIG. 1 includes the cells 52 and 55. The layer 44 (including the cells 51, 52, and 53) includes a first electrically conductive material. The layer 45 (including the cells 54, 55, and 56) includes a second electrically conductive material. Cells 52 and 55 (but not cells 51, 54, 53, and 56) will be subsequently irradiated by the laser radiation 14.

Figure 5:
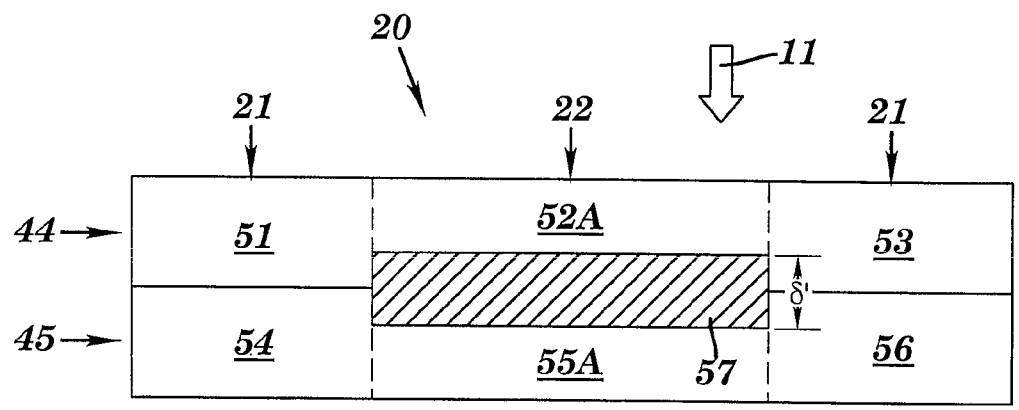
FIG. 5 depicts the two-layer embodiment of the resistor of FIG. 4 after being irradiated with the laser radiation.

FIG. 5 illustrates the two-layer embodiment of the resistor 20 of FIG. 4 after the cells 52 and 55 have been irradiated with the laser radiation 14. By heating the first electrically conductive material in the cell 52 and the second electrically conductive material in the cell 55, the laser radiation 14 has caused the first electrically conductive material in the cell 52 to chemically react with the second electrically conductive material in the cell 55 to form a third electrically conductive material at an interface of the cell 52 and the cell 55. The third electrically conductive material comprises a chemical combination of the first electrically conductive material and the second electrically conductive material. Accordingly, FIG. 5 shows the cells 52 and 55 of FIG. 4 as having been transformed into the cells 52A, 57, and 55A. Cell 52A is an unreacted portion of cell 52 and includes the first electrically conductive material as unreacted. Cell 55A is an unreacted portion of cell 55 and includes the second electrically conductive material as unreacted. Cell 57 includes the third electrically conductive material formed by the aforementioned chemical reaction between portions of the first electrically conductive material and the second electrically conductive material. Thus, the electrical resistance $R_2$ of the laser-exposed resistor 20 differs from the initial electrical resistance $R_1$ because cell 57 includes the third electrically conductive material which has a different electrical resistivity from that of the first electrically conductive material and the second electrically conductive material. In a first example in which $R_2 > R_1$, the first electrically conductive material includes titanium, the second electrically conductive material includes aluminum, and the third electrically conductive material includes titanium trialuminide. In a second example in which $R_2 < R_1$, the first electrically conductive material includes cobalt, the second electrically conductive material includes silicon, and the third electrically conductive material includes cobalt silicide. In addition to the preceding examples for the first, second, and third electrically conductive materials, many other possible materials, as are known to one of ordinary skill in the art, could be used for the first, second, and third electrically conductive materials. The magnitude of the resistance change $R_2 - R_1$ is a function of a thickness $\delta'$ of the cell 57. $\delta'$ increases as the time of exposure $t_2 - t_1$ increases until the cells 52 and 55 have fully reacted, after which $\delta'$ will no longer increase. If the resistor 20 has been fully reacted, all of the first electrically conductive material of cell 52 and/or all of the second electrically conductive material of the cell 55 may have been participated in the chemical reaction that generated the third electrically conductive material of cell 57. If all of the first electrically conductive material of cell 52 participated in the aforementioned chemical reaction, then the cell 52A does not appear in FIG. 5 and $\delta'$ is increased such that the cell 57 occupies the entire space of cell 52A in FIG. 5. If all of the second electrically conductive material of cell 55 participated in the aforementioned chemical reaction, then the cell 55A does not appear in FIG. 5 and $\delta'$ is increased such that the cell 57 occupies the entire space of cell 55A in FIG. 5.

Figure 6:
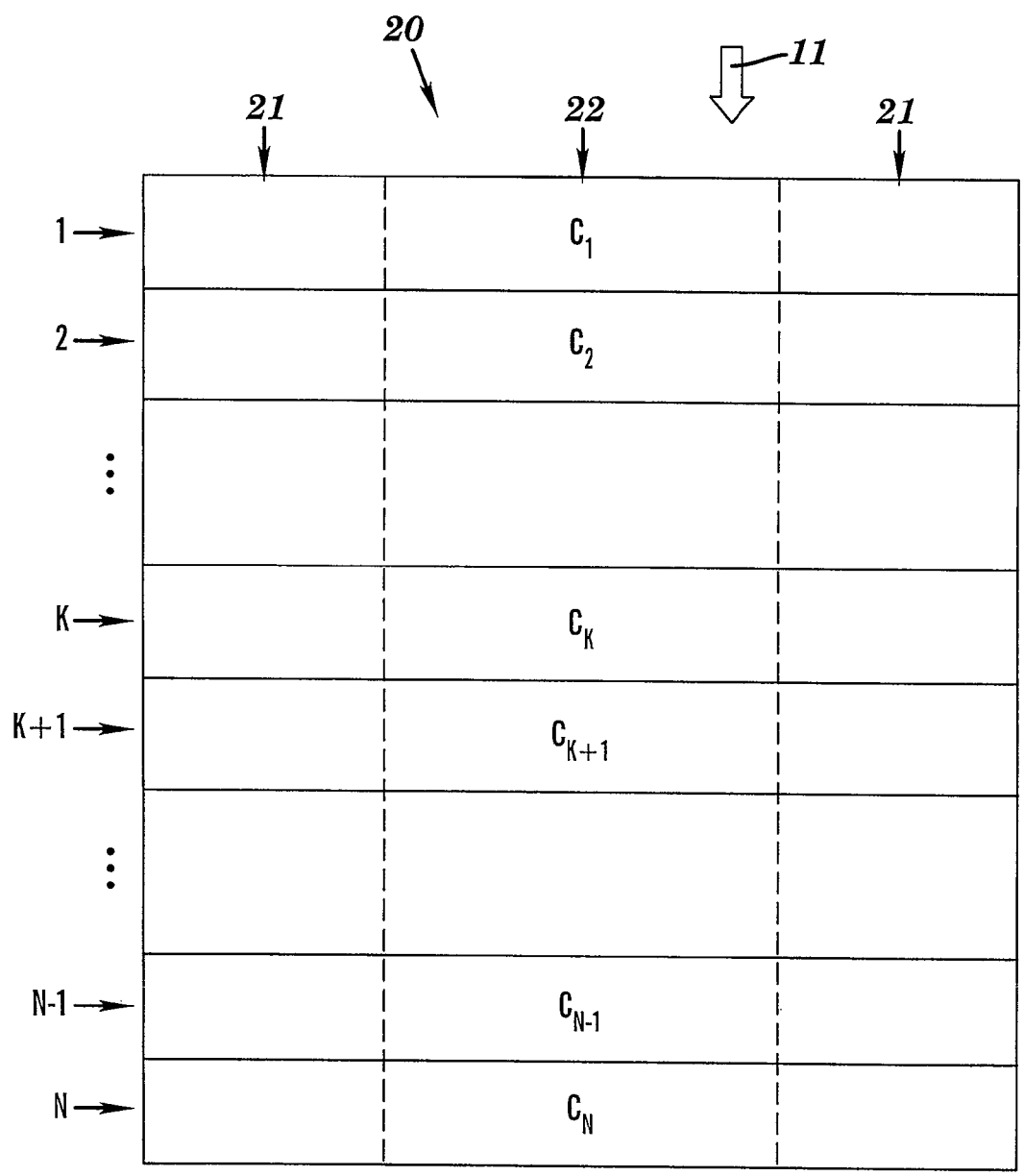
FIG. 6 depicts a multi-layer embodiment of the resistor of FIG. 1 prior to being irradiated with the laser radiation.

FIG. 6 illustrates a multi-layer embodiment of the resistor 20 of FIG. 1 prior to being irradiated with the laser radiation 14. In FIG. 6, the resistor 20 comprises N layers, namely layers 1, 2, . . . , N, wherein N is at least 2. Layer J is in electrically conductive contact with layer J+1 for J=1, 2, . . . , N−1. Layer K includes an electrically conductive material $M_K$ for K=1, 2, . . . , N. The block 71 of FIG. 1 of the first portion 21 of the resistor 20 includes N cells as shown in FIG. 6. The block 73 of FIG. 1 of the first portion 21 of the resistor 20 includes N cells as shown in FIG. 6. The block 72 of FIG. 1 of the second portion 22 of the resistor 20 includes N cells as shown in FIG. 6 and hereby denoted as cells $C_1$, $C_2$, . . . , $C_N$. Note that cell $C_K$ is in the portion 22 of layer K for K=1, 2, . . . , N. The N cells of the second portion 22 (but not the cells of the first portion 21) will be subsequently irradiated by the laser radiation 14.

Figure 7:
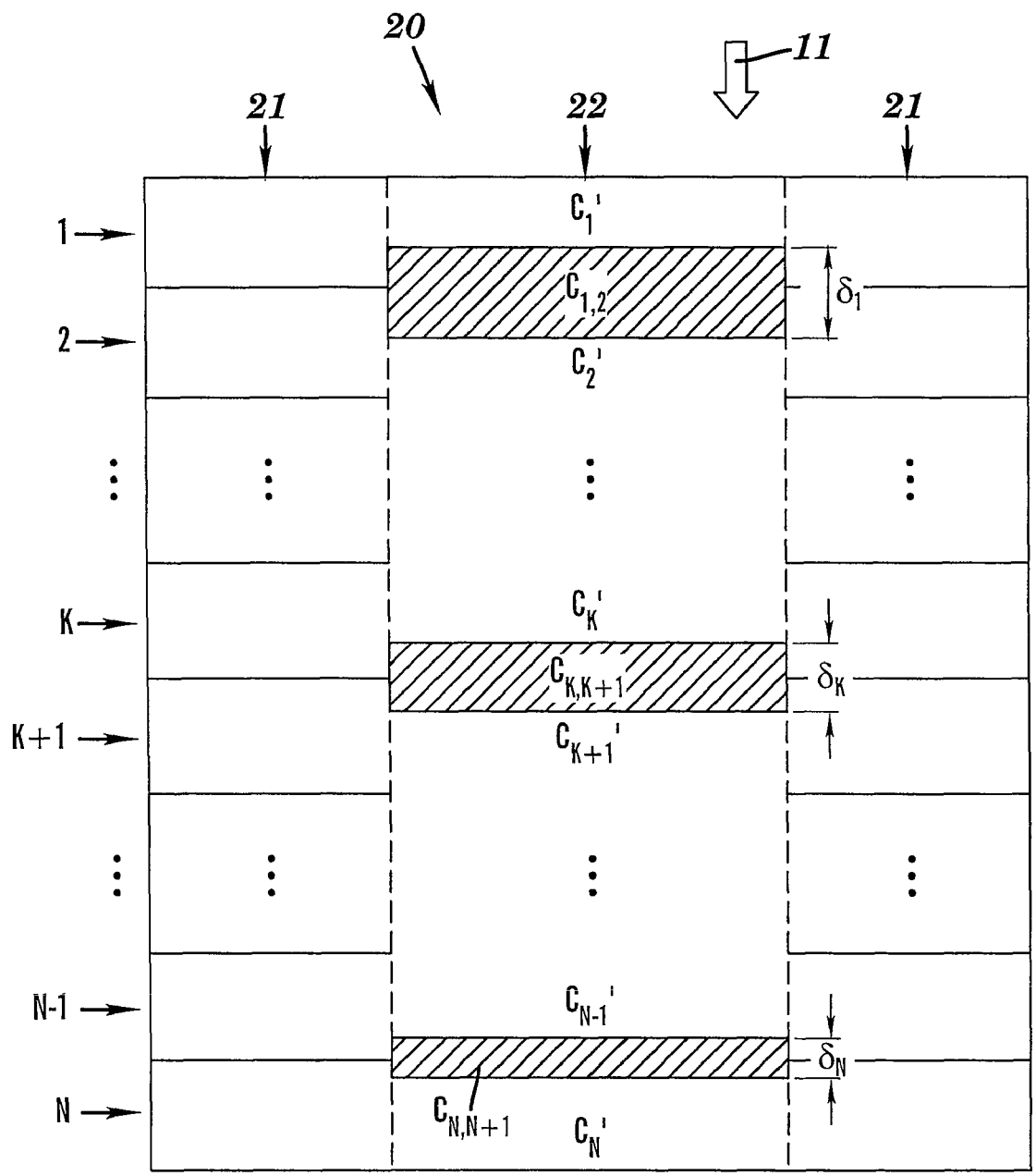
FIG. 7 depicts the multi-layer embodiment of the resistor of FIG. 6 after being irradiated with the laser radiation.

FIG. 7 illustrates the multi-layer embodiment of the resistor 20 of FIG. 6 after being irradiated with the laser radiation 14. By heating the cells $C_1, C_2, \ldots, C_N$ of the portion 22, the laser radiation 14 may have caused the electrically conductive material $M_K$ in cell $C_K$ and the electrically conductive material $M_{K+1}$ in cell $C_{K+1}$ to chemically react to form an electrically conductive material $C_{K,K+1}$ at an interface between cells $C_K$ and $C_{K+1}$, wherein K=1, 2, . . . , N−1. The electrically conductive material $M_{K,K+1}$ comprises a chemical combination of the electrically conductive materials $M_K$ and $M_{K+1}$ of cells $C_K$ and $C_{K+1}$, respectively. Accordingly, FIG. 7 shows the cells $C_1, \ldots, C_K, \ldots, C_N$ of FIG. 6 as having been transformed into the cells $C_1'$, $C_{1,2}$, $C_2'$, . . . , $C_K'$, $C_{K,K+1}$, $C_{K+1}'$, . . . , $C_{N-1}'$, $C_{N-1,N}$, and $C_N'$. Cells $C_1'$, $C_2'$, . . . , $C_N'$ represent an unreacted portion of cells $C_1, C_2, \ldots, C_N$, respectively. Cell $C_{K,K+1}$ includes the material $M_{K,K+1}$ formed by the aforementioned chemical reaction between the material $M_K$ of cell $C_K$ and the material $M_{K+1}$ of cell $C_{K+1}$ for K=1, 2, . . . , N−1. Thus, the electrical resistance $R_2$ of the laser-exposed resistor 20 differs from the initial electrical resistance $R_1$ because cell $C_{K,K+1}$ (for K=1, 2, . . . , N−1) includes the electrically conductive material $M_{K,K+1}$ which has a different electrical resistivity from that of the materials $M_K$ and $M_{K+1}$. The magnitude of the resistance change $R_2 - R_1$ is a function of the thicknesses $\delta_K$ of the cells $C_{K,K+1}$ for K=1, 2, . . . , N−1. The thicknesses $\delta_K$ increase as the time of exposure $t_2 - t_1$ increases until the cells $C_1, C_2, \ldots, C_N$ have fully reacted, after which the thicknesses $\delta_K$ will no longer increase. If the second portion 22 of the resistor 20 has been fully reacted, all of the electrically conductive material of the cell $C_1, C_2, \ldots, C_N$, or combinations thereof may have participated in the chemical reaction that generated the cells $C_{K,K+1}$ for K=1, 2, . . . , N−1. If all of the electrically conductive material of the cell $C_K$ (K=1, 2, . . . , N) participated in the aforementioned chemical reaction, then the cell $C_K'$ does not appear in FIG. 7 and the thickness $\delta_K$ of the cell $C_{K,K+1}$ is increased such that the cell $C_{K,K+1}$ includes the entire space of cell $C_K$ in FIG. 7. Note that cell $C_K$ and cell $C_{K+1}$ may not chemically react for every K of K=1, 2, . . . , N−1, because the laser radiation 14 may not be sufficiently energetic for some materials $M_K$ and $M_{K+1}$ to chemically react. Thus the cell $C_{K,K+1}$ may not be formed for each K of K=1, 2, . . . , N−1.

Note the two-layer embodiment of FIGS. 4 and 5 represent a special case of N=2 of the multi-layer embodiment of FIGS. 6 and 7, respectively.

Figure 8:
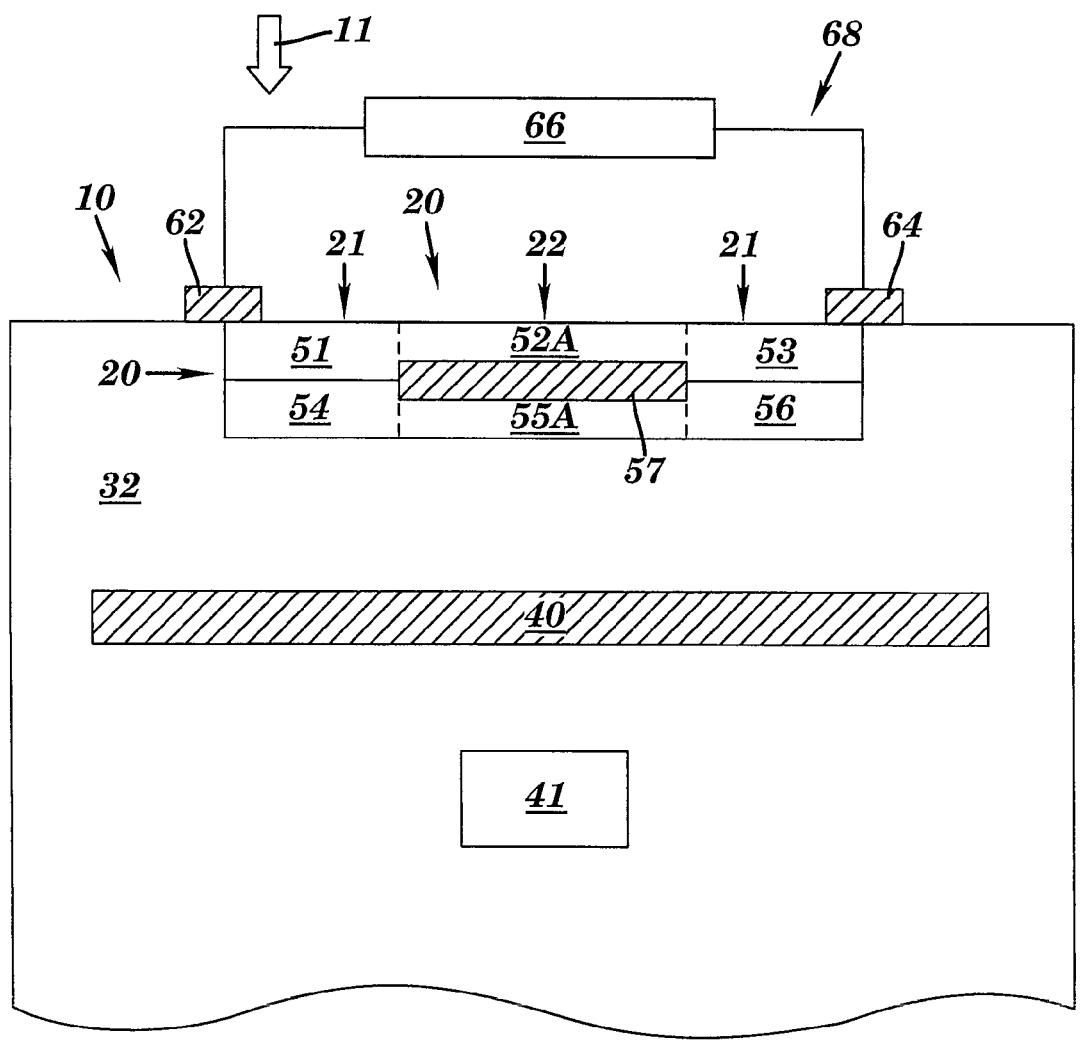
FIG. 8 depicts the electronic structure of FIG. 1 after the resistor has been irradiated with the laser radiation and an electrical circuit element has been conductively coupled to the resistor.

FIG. 8 illustrates the electronic structure of FIG. 1 after the resistor 20 has been irradiated with the laser radiation 14 and an electrical circuit element 66 has been conductively coupled to the resistor 20 by interfacing conductive contacts 62 and 64. As a result, an electrical circuit 68 has been formed, wherein the electrical circuit 68 comprises the electrical circuit element 66 and the resistor 20.

While the embodiments of the present invention, as depicted in FIGS. 1-8 and described herein, relate to shining a laser beam on, and heating, a fraction F of a length L of a resistor, the formulation presented herein is equally applicable to shining the laser beam on, and heating, the fraction F of an area A of the resistor. In this latter formulation, L (and related lengths such as $L_{1A}$, $L_2$, $L_{1B}$, etc.) could be replaced by A (and corresponding related areas) in the text of the detailed description presented herein. Also, linear dimensions in terms of microns for the length L formulation should by replaced by area dimension of microns×microns for the area (A) formulation. For example, the statement supra that "the present invention may be used for both large portions of resistors (i.e., a product of F and L exceeds about 1 micron) and small portions of resistors (i.e., a product of F and L does not exceed about 1 micron)" should be replaced for the area (A) formulation by a statement that "the present invention may be used for both large portions of resistors (i.e., a product of F and A exceeds about 1 micron×1 micron) and small portions of resistors (i.e., a product of F and A does not exceed about 1 micron×1 micron)." Additionally, any claims presented infra herein in terms of the length (L) formulation are intended to be broadly interpreted in terms of both the length (L) formulation and the area (A) formulation.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electrical resistor of length L, comprising N layers denoted as layers 1, 2, . . . , N:
   wherein a portion of the resistor includes a fraction F of the length L;
   wherein N is at least=2;
   wherein layer I includes an electrically conductive material $M_I$ for I=1, 2, . . . N;
   wherein layer J is in electrically conductive contact with layer J+1 for J=1, 2, . . . , N−1; and
   wherein a cell $C_{K,K+1}$ couples a cell $C_K'$ of the layer K to a cell $C_{K+1}'$ of the layer K+1, wherein the cell $C_K'$ is totally within the portion of the resistor and includes the material $M_K$, wherein the cell $C_{K+1}'$ is totally within the portion of the resistor and includes the material $M_{K+1}$, wherein the cell $C_{K,K+1}$ is totally within the portion of the resistor and includes an electrically conductive material $M_{K,K+1}$ that comprises a chemical combination of the material $M_K$ from the layer K and the material $M_{K+1}$ from the layer K+1, and wherein K is selected from the group consisting of 1, 2, . . . , N−1, and combinations thereof.

2. The electrical resistor of claim 1, wherein a product of F and L does not exceed about 1 micron.

3. The electrical resistor of claim 1, further comprising:
   a semiconductor substrate coupled to the resistor;
   a first electrically conductive contact conductively coupled to the resistor;
   a second electrically conductive contact conductively coupled to the resistor; and
   an electrical circuit element coupled to the first electrically conductive contact and to the second electrically conductive, wherein an electrical circuit includes the electrical circuit element and the resistor.

4. The electrical resistor of claim 1, wherein N is greater than 2.

5. The electrical resistor of claim 1, wherein the chemical combination of the material $M_K$ from the layer K and the material $M_{K+1}$ from the layer K+1 is a reaction product that would result from a chemical reaction between the material $M_K$ from the layer K and the material $M_{K+1}$ from the layer K+1.

6. An electrical resistor of length L, comprising N layers denoted as layers 1, 2, . . . , N:
   wherein a portion of the resistor includes a fraction F of the length L;
   wherein N is at least 2;
   wherein layer I includes an electrically conductive material $M_I$ for I=1, 2, . . . N;
   wherein layer J is in electrically conductive contact with layer J+1 for J=1, 2, . . . , N−1;
   wherein a cell $C_{K,K+1}$ couples a cell $C_K'$ of the layer K to a cell $C_{K+1}'$ of the layer K+1, wherein the cell $C_K'$ is totally within the portion of the resistor and includes the material $M_K$, wherein the cell $C_{K+1}'$ is totally within the portion of the resistor and includes the material $M_{K+1}$, wherein the cell $C_{K,K+1}$ is totally within the portion of the resistor and includes an electrically conductive material $M_{K,K+1}$ that comprises a chemical combination of the material $M_K$ from the layer K and the material $M_{K+1}$ from the layer K+1, wherein K is selected from the group consisting of 1, 2, . . . , N−1, and combinations thereof;
   wherein a first bounding surface of the cell $C_{K,K+1}$ is in direct mechanical contact with the cell $C_K'$;
   wherein a second bounding surface of the cell $C_{K,K+1}$ is in direct mechanical contact with the cell $C_{K+1}'$, wherein the first bounding surface of the cell $C_{K,K+1}$ is opposite to and parallel to the second bounding surface of the cell $C_{K,K+1}$; and wherein the electrically conductive material $M_{K,K+1}$ is distributed throughout the cell $C_{K,K+1}$.

7. The electrical resistor of claim 6, wherein a product of F and L does not exceed about 1 micron.

8. The electrical resistor of claim 6, further comprising:
   a semiconductor substrate coupled to the resistor;
   a first electrically conductive contact conductively coupled to the resistor;
   a second electrically conductive contact conductively coupled to the resistor; and
   an electrical circuit element coupled to the first electrically conductive contact and to the second electrically conductive, wherein an electrical circuit includes the electrical circuit element and the resistor.

9. The electrical resistor of claim 6, wherein N is greater than 2.

10. An electrical resistor of length L, comprising:
    a first portion having a length $L_1$, wherein the first portion includes at least one cell having an electrically conductive material with a first structure; and
    a first portion having a length $L_1$, wherein the first portion includes at least one cell having a first electrically conductive material with a first structure; and
    a second portion of length $L_2$ such that $L_2 = L - L_1$, wherein the second portion includes a fraction F of the length L such that $F = L_2/L$, wherein the second portion includes a structured cell having a second electrically conductive material with a second structure, and wherein the second electrically conductive material with the second structure has resulted from a laser heating of the first electrically conductive material with the first structure.
    wherein:
    the first structure includes an amorphous metallic material structure and the second structure includes a crystalline metallic structure, said amorphous metallic material structure including an amorphous metallic material selected from the group consisting of titanium nitride, tantalum silicon nitride, and tungsten nitride; or
    the first electrically conducting material includes a polycrystalline metal having a first crystalline phase and the second electrically conducting material includes the polycrystalline metal having a second crystalline phase, said polycrystalline metal including tantalum, said first crystalline phase including a tetragonal phase, said second crystalline phase including a body-centered cubic phase; or the first structure includes a metallic oxide selected from the group consisting of a metal oxide and a metallic alloy oxide and the second structure includes a metallic component, said metallic component being the metal if the metallic oxide is the metal oxide, said metallic component being the metallic alloy if the metallic oxide is the metallic alloy oxide, said metal oxide being platinum oxide, palladium oxide, irridium oxide, or platinum palladium oxide.

11. The electrical resistor of claim 10, wherein the second portion further comprises a first structured cell that includes the first electrically conductive material with the first structure, and wherein the first structured cell is coupled to the structured cell.

12. The electrical resistor of claim 10, wherein the at least one cell includes a first cell and a second cell, and wherein the structured cell is disposed between the first cell and the second cell.

13. The electrical resistor of claim 10, wherein a product of F and L does not exceed about 1 micron.

14. The electrical resistor of claim 10, further comprising:
a semiconductor substrate coupled to the resistor;
a first electrically conductive contact conductively coupled to the resistor;
a second electrically conductive contact conductively coupled to the resistor; and
an electrical circuit element coupled to the first electrically conductive contact and to the second electrically conductive contact, wherein an electrical circuit includes the electrical circuit element and the resistor.

* * * * *